(12) United States Patent  
Gaul

(10) Patent No.: US 8,288,892 B2  
(45) Date of Patent: Oct. 16, 2012

(54) SERIES/PARALLEL POWER SUPPLY SWITCHING

(75) Inventor: Stephen Joseph Gaul, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 366 days.

(21) Appl. No.: 12/707,103

(22) Filed: Feb. 17, 2010

(65) Prior Publication Data

US 2011/0101787 A1 May 5, 2011

Related U.S. Application Data

(60) Provisional application No. 61/256,146, filed on Oct. 29, 2009.

(51) Int. Cl.
*H02J 1/00* (2006.01)
(52) U.S. Cl. .......................................... 307/71
(58) Field of Classification Search ...................... 307/71
See application file for complete search history.

(56) References Cited

U.S. PATENT DOCUMENTS

| 6,624,535 | B2 * | 9/2003 | Morrow ........................ 307/71 |
| 2009/0220209 | A1 | 9/2009 | Mori |
| 2010/0186795 | A1 | 7/2010 | Gaul |
| 2010/0186799 | A1 | 7/2010 | Gaul |

OTHER PUBLICATIONS

Gaul, "Switchable Solar Cell Devices", U.S. Appl. No. 12/470,325, filed May 21, 2009.
Gaul, "Connection Systems and Methods for Solar Cells", U.S. Appl. No. 12/470,351, filed May 21, 2009.
Nguyen et al., "A Reconfigurable Solar Photovoltaic Array Under Shadow Conditions", IEEE Xplore, Oct. 11, 2008, pp. 980-986.
Perlaky et al., "Sensor Powering with Integrated MOS Compatible Solar Cell Array", IEEE Xplore, Oct. 14, 2008, 3 pgs.

* cited by examiner

*Primary Examiner* — Robert L. Deberadinis
(74) *Attorney, Agent, or Firm* — Fogg & Powers LLC

(57) ABSTRACT

A device which can dynamically configure an array of power supply cells such as photovoltaic (PV) solar cells to provide power to a load device based on the power requirements of the load device. By selectively configuring the array of power supply cells according to one of a number of available series/parallel connection schemes, the supplied power can be more closely tailored by a controller to the requirements of the load device.

22 Claims, 5 Drawing Sheets

| Binary Tree (Bits X-Y) | Binary Tree (Bits A-B-C-/A-/B-/C) | SERIES | PARALLEL |
|---|---|---|---|
| 1-1 | 1-1-1-0-0-0 | 8 | 1 |
| 1-0 | 0-1-1-1-0-0 | 4 | 2 |
| 0-1 | 0-0-1-1-1-0 | 2 | 4 |
| 0-0 | 0-0-0-1-1-1 | 1 | 8 |

SERIES/PARALLEL POWER SUPPLY SWITCHING

PRIORITY

This application claims priority from U.S. provisional application 61/256,145 filed Oct. 29, 2009, which is incorporated herein by reference in its entirety.

FIELD OF THE INVENTION

This invention relates to the field of power management, and more specifically to a variable power control scheme capable of switching between devices in series, devices in parallel, and combinations thereof.

BACKGROUND OF THE INVENTION

Various devices which supply power, such as batteries and solar modules (i.e. solar panels), operate under a variety of conditions. For example, a curve of a load on a battery can be steep during startup of a device the battery is powering, which then levels off after startup. Solar modules can operate under a wide variety of power conditions depending on cloud levels, efficiency of individual cells in the solar module, maintenance conditions of the module, etc.

In a conventional solar module, for example, a plurality of photovoltaic (PV) cells which convert light energy into electricity are typically arranged in series. An advantage of connecting the cells in series is that power produced by each cell can be efficiently routed for immediate use or to a battery for storage. One problem with a series arrangement is that a cell which has decreased efficiency or is otherwise malfunctioning can adversely affect the remaining cells in the series. U.S. patent application Ser. No. 12/470,325 titled "Switchable Solar Cell Devices" and U.S. patent application Ser. No. 12/470,351 titled "Connection Systems and Methods for Solar Cells," each filed May 21, 2009 and incorporated by reference herein in its entirety, describe methods and structures for overcoming various problems associated with a series arrangement of cells.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

Devices which supply power, such as an array of batteries, solar cells, solar modules, or capacitors, typically include devices which make up the array connected in an electrical series arrangement (i.e. "in series"). A load connected to the power device, such as a motor, may draw a large amount of current during startup, which decreases after equilibrium has been reached. Powering such load devices using an array such as solar cells connected in series may not provide the most efficient power scheme, as the voltage and current requirements change during the course of operation of the device being powered.

Figure 1:
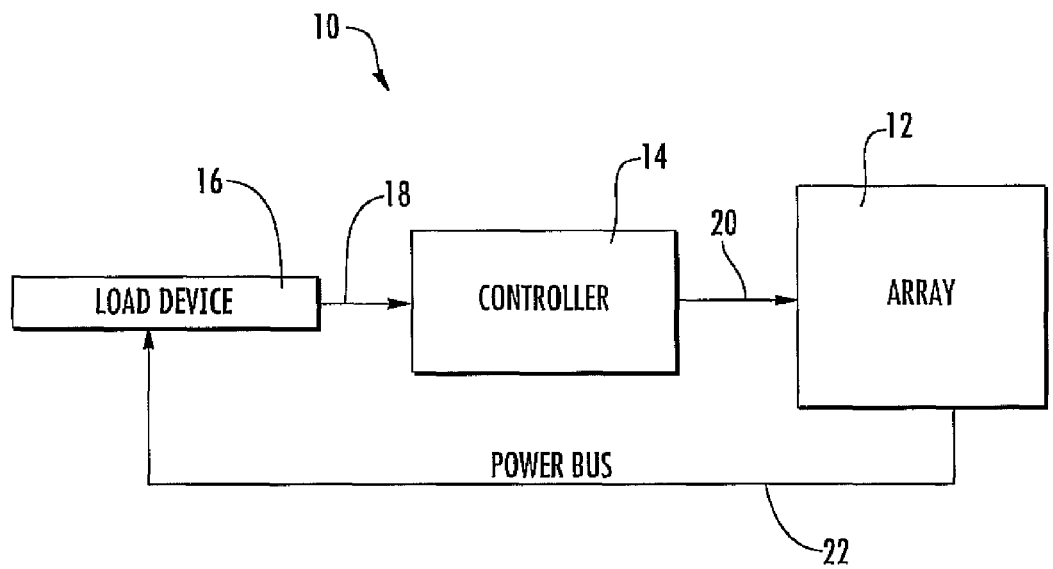
FIG. 1 is a block diagram depicting an overview of elements according to an embodiment the present teachings.

FIG. 1 depicts an overview of an embodiment 10 of the present teachings which can include, for example, an array of solar cells 12. For ease of explanation, the device of the present teachings will be described in terms of its use with an array of solar cells 12 included as part of a solar module, but it will be understood that the array 12 can also represent an array of batteries, solar modules, capacitors, etc. (i.e. "power supply cells") instead of the array of solar cells as described below. FIG. 1 further depicts a controller 14 for monitoring and controlling power supplied to a load device 16, e.g. an electric motor, for example used as part of a fluid pumping system such as a irrigation pump.

During operation, the controller 14 receives power usage information from the motor 16 through an output 18 from the load device 16. The controller 14 outputs a signal 20 to the array 12. Depending on the momentary power requirements of the device being powered 16, the controller can dynamically alter the electrical configuration of the solar cells 12. During high current use by the motor 16, for example which can be encountered during startup of the motor to run a fluid pump, the controller receives power use information from the load device and configures connections between solar cells 12 in parallel such that the motor can receive maximum current output from the array 12 through the power bus 22. During low current use by the motor 16, for example after fluid pumping equilibrium has been reached, the controller configures connections between solar cells 12 in series such that the motor can receive maximum voltage output from the array 12 through the power bus 22. During intermediate current/voltage operation, for example during a transition from startup to equilibrium or during other operating conditions, the solar cells can be interconnected by the controller with a combination of series and parallel connections to supply a more efficient current/voltage combination than either all series or all parallel connections. The controller 14 can, therefore, dynamically configure the electrical output 22 from the array 12 which supplies electrical power to the load device 16, such that it is tailored to the current and voltage demands of the load device. Electrical circuits and configurations for electrically removing and replacing an individual solar cell from an array of solar cells in a circuit are discussed in U.S. patent application Ser. Nos. 12/470,325 and 12/470,351, each of which has been incorporated herein by reference.

Figure 2:
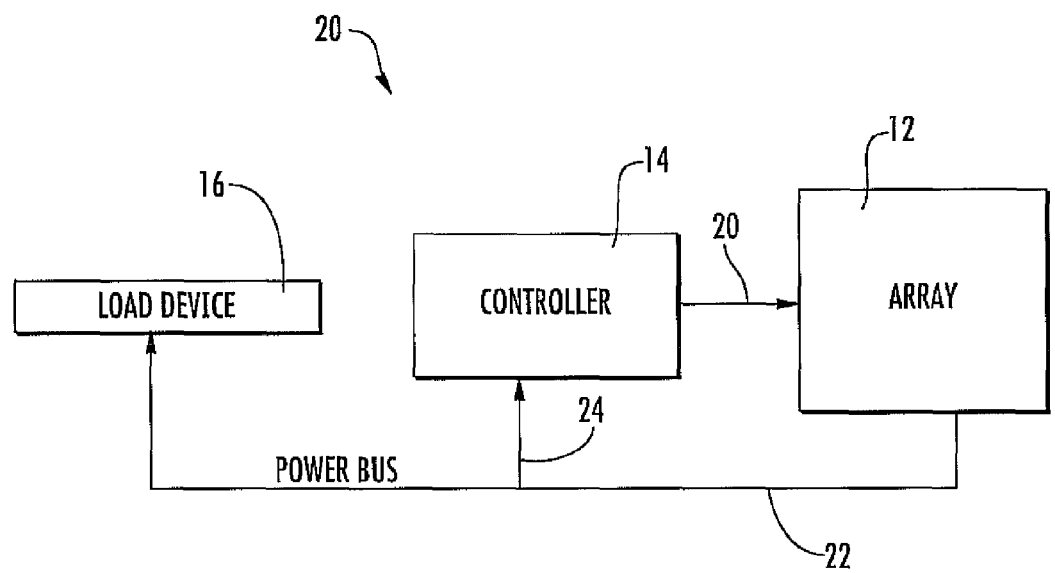
FIG. 2 is a block diagram depicting an overview of elements according to another embodiment of the present teachings.

FIG. 2 depicts another embodiment 20 in which the controller 14 monitors current and/or voltage use of the load device 16 directly from the power bus 22 from the array 12 to the load device 16 through an input 24. As electrical fluctuations occur on the power bus 22 resulting from changes in power use by the load device 16, the controller outputs signal 20 to the array 12 to alter the series/parallel connections between the cells in the array 12. This embodiment can omit the output 18 of FIG. 1 from the load device 16 to the controller 14.

Figure 3A:
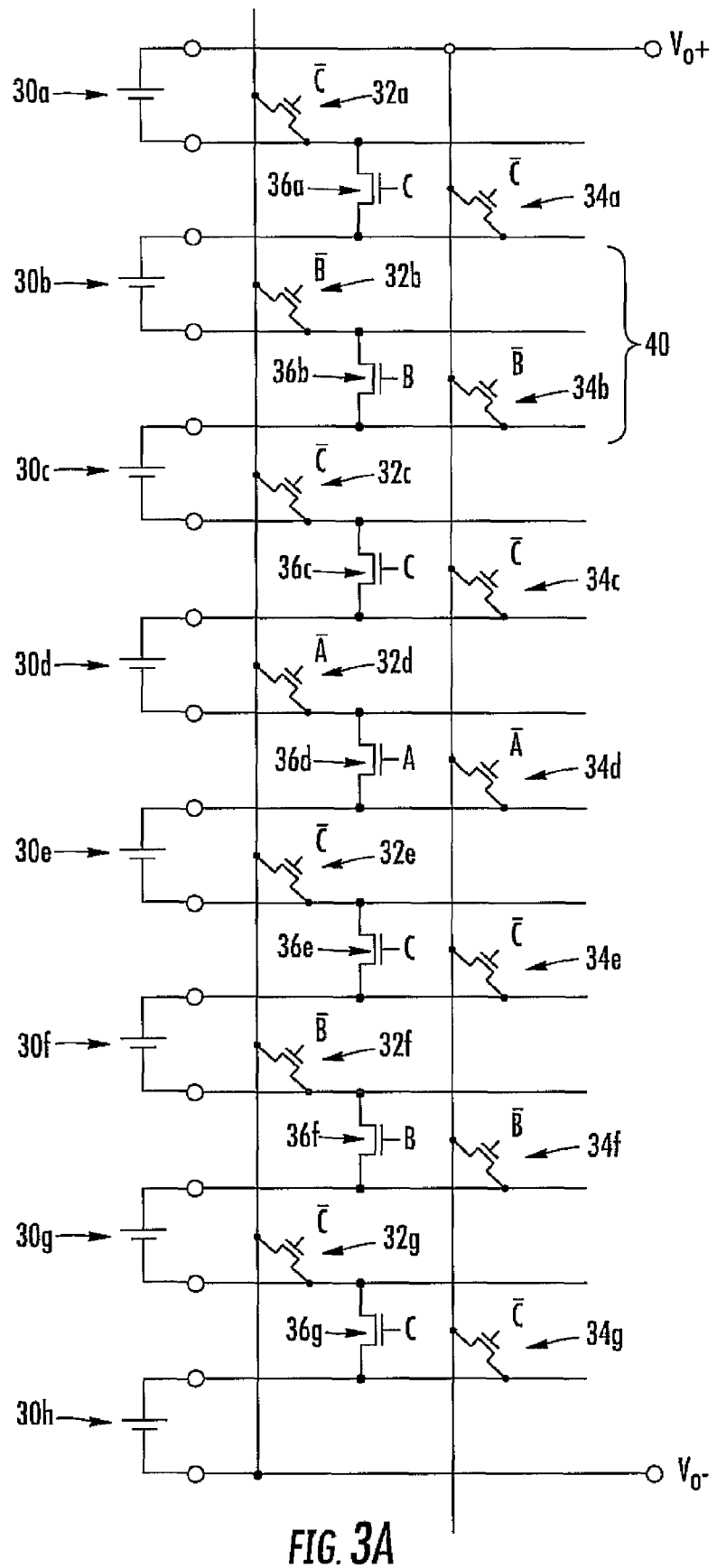
FIGS. 3A and 3B are elements of a circuit for an implementation of the present teachings.

FIG. 3A depicts a power cell array circuit which can be controlled in an embodiment of the present teachings. Eight photovoltaic (PV) solar cells 30a-30h can be connected in four different series/parallel arrangements to output four voltage/current levels. Outputs, $V_0+$ and $V_0-$ form the power bus to carry the combined generated power output of PV cells 30a-30h to the load device, and thus form the power bus 22 of FIGS. 1 and 2. For this embodiment, the circuit can also incorporate transistors 32-36, which include seven first level parallel transistors 32a-32g, seven second level parallel transistors 34a-34g, and seven series level transistors 36a-36g.

Figures 3B, 4:
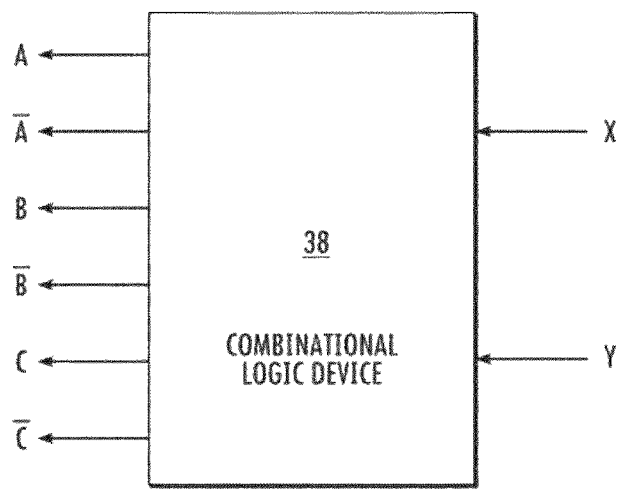
FIG. 4 is a table which indicates possible series/parallel circuit configurations based on the circuit of FIG. 2.

FIG. 3B depicts a combinational logic device 38 which can be part of controller 14 of FIGS. 1 and 2 which controls the inputs to transistors 32-36. In this embodiment, two inputs X and Y control the inputs to transistor 32-36. By inputting one of four available logic states on the two inputs X-Y, logic states on the parallel level transistor and series level transistors can be controlled such that eight solar cells can be configured all in series, all in parallel, or in a combination of series and parallel. The logic state of inputs X-Y are determined by the power demand of load device 16. The load device 16 can notify the controller 14 regarding power requirements on output 18 as depicted in FIG. 1, or the controller 13 can monitor the load device power requirements on the power bus 22 from the array 12 to the load device 16 as depicted in FIG. 2.

FIG. 4 is a binary ladder which describes the possible series/parallel combinations of the eight cells 20a-20f using the two inputs X-Y. The two inputs X-Y control the three logic bits (control bits) A, B, C and their complements /A, /B, and /C of FIGS. 3A and 3B, for example using digital logic such as metal oxide semiconductor field effect transistors (MOSFETs). The binary ladder in FIG. 4 and circuit of FIGS. 3A and 3B demonstrate control of the 8 power supply cells 20a-20h to provide 4 possible series/parallel combinations using the two inputs X-Y. It should also be understood that the FETs of the present embodiment can be replaced with semiconductor switches including NMOS, PMOS, NJFET, PJFET, NDMOS or PDMOS devices, pass gates (parallel NMOS and PMOS to provide bi-directional connection), relays or other electronic, mechanical or semiconductor switches in other embodiments.

Figure 5:
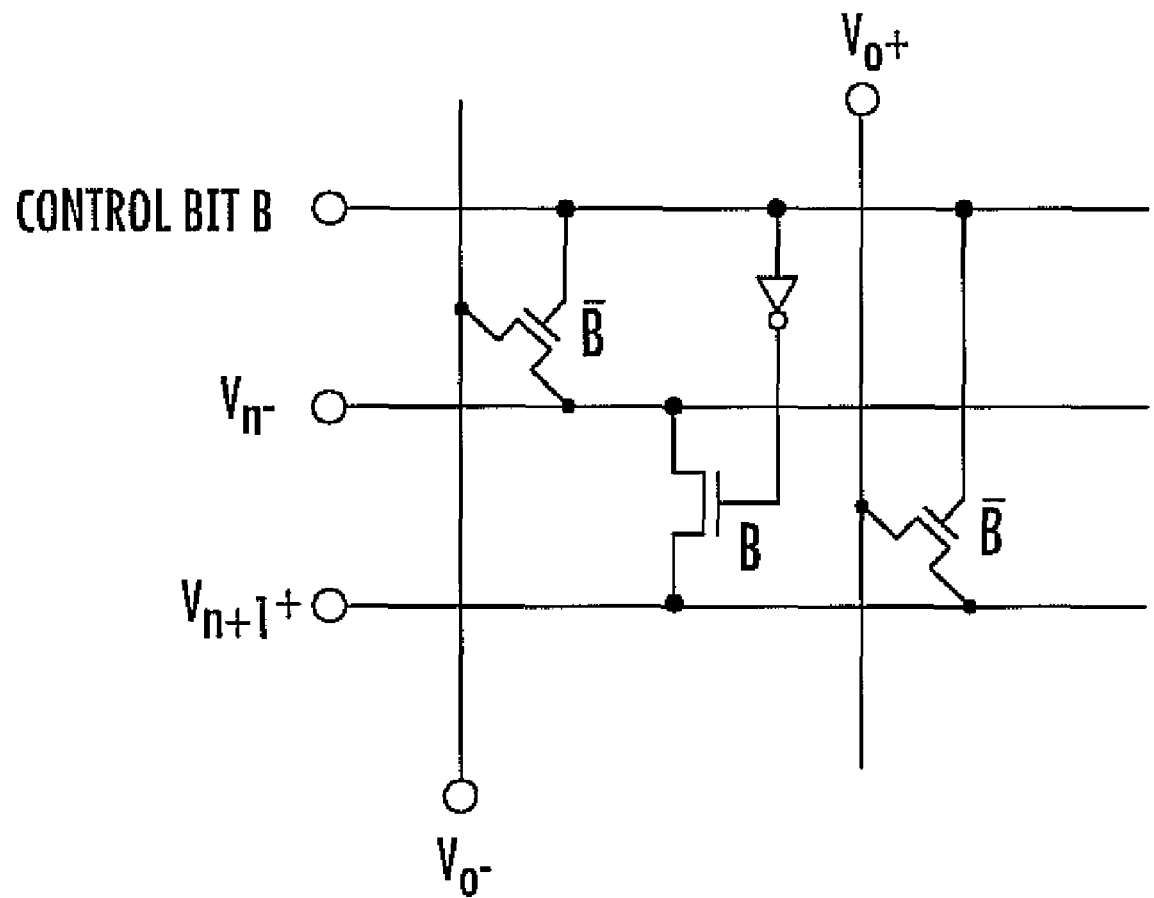
FIG. 5 is circuit schematic depicting detail of an individual switching cell of the FIG. 3A circuit.

FIG. 5 depicts circuitry associated with the interconnection between two solar cells, in this case cells 30b and 30c of FIG. 3A, reference number 40 of FIG. 3A. Using, for example, control bit B provided by combinational logic 38 which results from the logic on inputs X and Y, solar cells 30b and 30c can be connected in series or in parallel to optimize their current/voltage output, depending on the requirements of the load device. This can be performed dynamically by the controller with minimal circuitry while tailoring the supplied power for the requirements of the load device.

Figure 6:
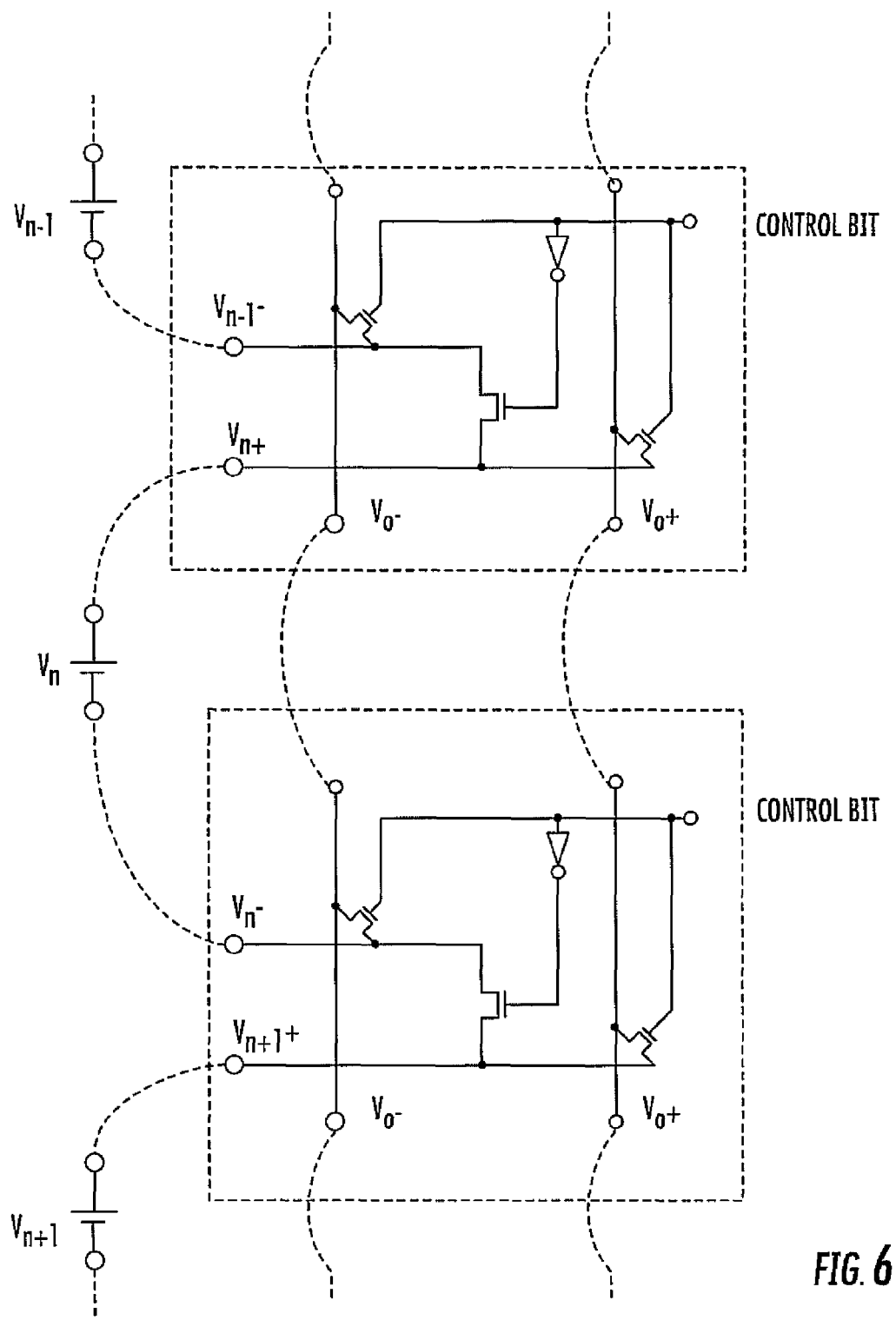
FIG. 6 is a circuit schematic depicting the use of two or more individual cell as shown in FIG. 5 to connect together two or more power sources.

FIG. 6 depicts a general use of an arbitrary number of building block circuits of FIG. 5 to connect an arbitrary number of power generation cells together It will be realized that the use of two building block circuits of FIG. 5 can connect the three depicted solar cells ($V_{n-1}$, $V_n$, and $V_{n+1}$) all in series, all in parallel, or in a series/parallel combination to tailor a voltage/current output on $V_0+$ and $V_0-$. Any number of FIG. 5 building block circuits can be connected to any number of solar cells and other FIG. 5 building block circuits to provide scaling for larger numbers of solar cells, for example 8 solar cells as in FIG. 3A.

Thus the teachings of the present disclosure provide a power supply device which can be dynamically configured in two or more different series/parallel arrangements depending on the power requirements of a load which is electrically connected to the power supply device. The series/parallel arrangement can be dynamically configured to suit discharging or charging situations. Using logic on two controller inputs X and Y which is determined from power use information supplied by the load device, the controller can dynamically alter the power configuration output by the array. When the load device requires a high current for most efficient operation, for example during startup, this information is received by the controller, and the controller dynamically configures the array circuitry in parallel to output maximum current to the load device. When the load device reaches equilibrium and requires low current, high voltage power for most efficient operation, for example after startup and during steady fluid pumping, this information is received by the controller which dynamically configures the array circuitry in series to output maximum voltage to the load device. During intermediate current/voltage requirements, the controller can configure the array in a combination series/parallel arrangement. For example, a logic input of 1-0 on X-Y as described in FIG. 4 and eight power supply cells can result in a combination series/parallel arrangement including each of two groups of four cells connected in series, with the two groups connected together in parallel. Another combination series/parallel arrangement using eight power supply cells can include each of four groups of two cells connected in series, with the four groups connected together in parallel.

While an array with eight solar cells and two controller inputs X and Y is described and depicted in FIGS. 3 and 4, it will be understood that any number of solar cells or power supply cells can be so configured with the appropriate number of controller inputs as described in FIG. 6. The number of possible series/parallel combinations is generally proportional to the number of cells, with the number of control bits determined by the number of desired series/parallel combinations.

Considering that for a given number of solar cells or power supply cells n, the number of combinations available will be at least two because n can be factored into n×1 and 1×n combinations. FIG. 6 provides a generalization of the approach to any number of solar cells or power supply cells. There can be advantages, however, to using numbers of solar cells or power supply cells that can be factored into many combinations. Using values of n that correspond to powers of a base value, such as $x^y$ (where the base number x is a prime number and y is any integer power) can provide an advantage when seeking the most combinations from a given number of solar cells or power supply cells. For example, the embodiment of FIG. 3A corresponds to $n=2^3=8$. For any n that can be expressed as a prime number to a power, the number of combinations will be y+1, yielding 4 combinations for the FIG. 3A embodiment. Furthermore, combining several powers, such as $n=(x^y)(a^b)$ can provide a method where the number of solar or power cells can be optimized to provide a given number of combinations. For example, when the number of cells $n=(2^1)(3^1)=6$, the number of combinations will correspond to $(y+1)(b+1)=(1+1)(1+1)=4$. This is the same number of combinations provided by the FIG. 3A example while using fewer solar or power cells (6 cells versus 8).

For the example where a stack of 6 solar cells (n=6) provides 4 unique series/parallel combinations (6×1, 3×2, 2×3 and 1×6) requiring 2 control bits, a stack of 8 solar cells likewise also provides 4 unique series/parallel combinations (8×1, 4×2, 2×4 and 1×8) requiring 2 control bits (X, Y in FIG.

3B). There can be a simplification of the control bit logic, depending on the number of cells and the number of combinations/control bits required.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A device for supplying power to a load device, comprising:
    an array of power supply cells;
    a controller electrically connected to the array of power supply cells, wherein the controller is adapted to receive power operating requirement information for a load device; and
    a plurality of switches electrically connected to the array of power supply cells and to the controller, wherein the controller is adapted to configure the plurality of switches based on the power operating requirement information received by the controller for the load device, wherein each pair of adjacent power supply cells in the array of power supply cells are interconnected by a configuration including only three single pole, single throw switches of the plurality of switches.

2. The device of claim 1, wherein the array of power supply cells is an array of photovoltaic solar cells.

3. The device of claim 2, wherein the load device is an electric motor.

4. The device of claim 1, wherein the array of power supply cells is an array of batteries.

5. The device of claim 1, wherein the array of power cells is an array of capacitors.

6. The device of claim 1, wherein the controller is adapted to configure the plurality of switches in at least three configurations such that the array of power supply cells can be dynamically configured in a first arrangement with only one series circuit, in a second arrangement with only one parallel circuit, and in a third arrangement with at least two parallel circuits and at least two series circuits based on the power operating requirement information received by the controller for the load device.

7. A method for supplying power to a load device, comprising:
    receiving power operating requirement information from a load device at a controller;
    based on the power operating requirement information, outputting a signal from the controller to a plurality switches;
    configuring the plurality of switches based on the signal output from the controller; and
    configuring an electrical interconnection between a plurality of power supply cells which are electrically coupled with the plurality of switches, wherein for each pair of adjacent power supply cells in the plurality of power supply cells, a first signal is applied to a first semiconductor switch of the plurality of switches to configure a series connection between the pair of adjacent power supply cells and a second signal is applied to second and third semiconductor switches of the plurality of switches to configure the pair of adjacent power supply cells in parallel configurations,
    wherein the configuration of the switches controls a power output to the load device from the power supply cells.

8. The method of claim 7, further comprising altering a configuration of the switches based on the power operating requirement information from the load device to dynamically reconfigure an interconnection between the plurality of power supply cells, wherein the interconnection between the plurality of power supply devices can be selected from a first arrangement with only one series circuit and a plurality of parallel circuits, a second arrangement with only one parallel circuit and a plurality of series circuits, and a third arrangement with at least two parallel circuits and at least two series circuits based on the power operating requirement information received by the controller for the load device.

9. The method of claim 7, wherein configuring the electrical interconnection between the plurality of power supply cells comprises configuring an electrical interconnection between a plurality of solar cells.

10. The method of claim 7, wherein configuring the electrical interconnection between the plurality of power supply cells comprises configuring an electrical interconnection between a plurality of batteries.

11. The method of claim 7, wherein configuring the electrical interconnection between the plurality of power supply cells comprises configuring an electrical interconnection between a plurality of capacitors.

12. A method for supplying power to a load device, comprising:
inputting first power usage information from the load device to a controller;
based on the first power usage information input from the load device to the controller, outputting a first signal from the controller to configure a plurality of switches to a first logic state;
using the first logic state to configure electrical connections for an array of power supply cells such that the array of power supply cells is connected with a plurality of parallel circuits and only one series circuit;
inputting second power usage information from the load device to the controller;
based on the second power usage information input from the load device to the controller, outputting a second signal from the controller to configure the plurality of switches to a second logic state; and
using the second logic state to configure the electrical connections for the array of power supply cells such that the array of power supply cells is connected with only one parallel circuit and a plurality of series circuits, wherein the second logic state turns on one single pole, single throw switch between each pair of adjacent power supply cells in the array of power supply cells to couple the array of power supply cells in series.

13. The method of claim 12, further comprising:
inputting third power usage information from the load device to the controller;
based on the third power usage information input from the load device to the controller, outputting a third signal from the controller to configure the plurality of switches to a third logic state; and
using the third logic state to configure the electrical connections for the array of power supply cells such that the array of power supply cells is connected with at least two parallel circuits and at least two series circuits.

14. The method of claim 12 wherein configuring the electrical connections for the array of power supply cells comprises configuring the electrical connections for an array of solar cells.

15. The method of claim 12 wherein configuring the electrical connections for the array of power supply cells comprises configuring the electrical connections for an array of batteries.

16. The method of claim 12 wherein configuring the electrical connections for the array of power supply cells comprises configuring the electrical connections for an array of capacitors.

17. A system, comprising:
an array of power supply cells, wherein each of the power supply cells is dynamically configurable in parallel or series with one or more of the other power supply cells in the array of power supply cells;
a controller coupled to the array to control the configuration of the array of power supply cells;
a power bus coupled to the array; and
a load coupled to the power bus to receive power from the array of power supply cells;
wherein the controller monitors and controls power supplied to the load over the power bus by the array;
wherein the array of power supply cells includes a plurality of switches that are selectively activated to configure the power supply cells in parallel and serial combinations with one single pole single throw switch between each pair of power supply cells to configure the pair of power supply cells in a series combination; and
the controller includes a combinational logic circuit that generates control signals for the plurality of switches to produce a selected power to be provided to the load.

18. The system of claim 17, wherein the load comprises a motor.

19. The system of claim 17, wherein the load comprises a motor and a fluid pump driven by the motor.

20. The system of claim 17, wherein the power supply cells comprise at least one of batteries, solar modules, capacitors, and solar cells.

21. A system, comprising:
an array of power supply cells, wherein each of the power supply cells is dynamically configurable in parallel or series with one or more of the other power supply cells in the array of power supply cells;
a controller coupled to the array to control the configuration of the array of power supply cells;
a power bus coupled to the array;
a load coupled to the power bus to receive power from the array of power supply cells;
wherein the controller monitors and controls power supplied to the load over the power bus by the array; and
wherein the number of power supply cells, n, in the array of power supply cells is expressed by the equation $xy*ab$ wherein x and a are prime numbers and y and b are integer powers and wherein the number of combinations of configurations of the array of power supply cells is equal to $(y+1)*(b+1)$.

22. In an array of power supply cells, a switching circuit comprising:
a first switch, coupled between a positive terminal of an ith power supply cell and a negative terminal of an adjacent (i+1)th power supply cell, for coupling the adjacent power supply cells in series;
a second switch, coupled between a negative terminal of the ith power supply cell and a negative power supply rail for coupling the ith power supply cell into a parallel combination;
a third switch, coupled between a positive terminal of the (i+1)th power supply cell and a positive power supply rail for coupling the (i+1)th power supply cell into a parallel combination; and
wherein the switching circuit receives control signals to selectively activate the first, second and third switches so that the ith and the (i+1)th power supply cells are coupled into a selected combination of series and parallel connections of power supply cells of the array of power supply cells.

* * * * *

UNITED STATES PATENT AND TRADEMARK OFFICE
CERTIFICATE OF CORRECTION

PATENT NO. : 8,288,892 B2  
APPLICATION NO. : 12/707103  
DATED : October 16, 2012  
INVENTOR(S) : Gaul Page 1 of 1

It is certified that error appears in the above-identified patent and that said Letters Patent is hereby corrected as shown below:

At the Title page, Section (60), Related U.S. Application Data, replace "61/256,146" with --61/256,145--

Signed and Sealed this  
Fifth Day of February, 2013

Teresa Stanek Rea  
*Acting Director of the United States Patent and Trademark Office*